US009331211B2

(12) United States Patent
Stribley et al.

(10) Patent No.: US 9,331,211 B2
(45) Date of Patent: May 3, 2016

(54) PN JUNCTIONS AND METHODS

(75) Inventors: Paul Ronald Stribley, Devon (GB); Soon Tat Kong, Sarawak (MY)

(73) Assignee: X-FAB SEMICONDUCTOR FOUNDRIES AG, Erfurt (DE)

(*) Notice: Subject to any disclaimer, the term of this patent is extended or adjusted under 35 U.S.C. 154(b) by 0 days.

(21) Appl. No.: 13/393,039

(22) PCT Filed: Aug. 28, 2009

(86) PCT No.: PCT/GB2009/051082
§ 371 (c)(1),
(2), (4) Date: May 10, 2012

(87) PCT Pub. No.: WO2011/023922
PCT Pub. Date: Mar. 3, 2011

(65) Prior Publication Data
US 2012/0211747 A1 Aug. 23, 2012

(51) Int. Cl.
*H01L 29/49* (2006.01)
*H01L 29/866* (2006.01)
*H01L 23/525* (2006.01)
*H01L 29/06* (2006.01)

(52) U.S. Cl.
CPC .......... *H01L 29/866* (2013.01); *H01L 23/5252* (2013.01); *H01L 29/0688* (2013.01); *H01L 2924/0002* (2013.01)

(58) Field of Classification Search
CPC ........................... H01L 29/866; H01L 29/0688
USPC ............. 257/50, 51, 653, 654, 599, 603, 530, 257/529, 463, 465, E29.002, E29.003, 257/E29.335, E21.135, E29.001, E23.147, 257/E29.263, E21.592, E23.149
See application file for complete search history.

(56) References Cited

U.S. PATENT DOCUMENTS

| 3,094,633 | A | * | 6/1963 | Harries | 327/504 |
| 3,200,354 | A | * | 8/1965 | White | 257/416 |
| 3,368,123 | A | * | 2/1968 | Rittmann | 257/578 |
| 3,396,317 | A | * | 8/1968 | Vendelin | 257/654 |
| 3,480,845 | A | * | 11/1969 | Meer Winfried et al. | 257/583 |
| 3,725,136 | A | * | 4/1973 | Morgan | 438/167 |
| 3,794,892 | A | * | 2/1974 | Preston | 257/252 |
| 3,878,553 | A | * | 4/1975 | Sirles et al. | 257/522 |

(Continued)

FOREIGN PATENT DOCUMENTS

| EP | 0789403 | 8/1997 |
| GB | 2382220 | 5/2003 |

(Continued)

OTHER PUBLICATIONS

PCT, International Search Report, International Application No. PCT/GB2009/051082 (mailed May 11, 2010).

(Continued)

*Primary Examiner* — Michael Shingleton
(74) *Attorney, Agent, or Firm* — Thompson Hine LLP

(57) ABSTRACT

A PN junction includes first and second areas of silicon, wherein one of the first and second areas is n-type silicon and the other of the first and second areas is p-type silicon. The first area has one or more projections which at least partially overlap with the second area, so as to form at least one cross-over point, the cross-over point being a point at which an edge of the first area crosses over an edge of the second area.

20 Claims, 6 Drawing Sheets

(56) References Cited

U.S. PATENT DOCUMENTS

| | | | |
|---|---|---|---|
| 4,041,516 A * | 8/1977 | Murray | 257/93 |
| 4,494,135 A * | 1/1985 | Moussie | 257/50 |
| 4,517,583 A * | 5/1985 | Uchida | 257/67 |
| 4,532,537 A * | 7/1985 | Kane | 257/458 |
| 4,558,345 A * | 12/1985 | Dwyer et al. | 257/786 |
| 4,570,173 A * | 2/1986 | Anthony et al. | 257/618 |
| 5,343,069 A * | 8/1994 | Pluntke et al. | 257/583 |
| 5,365,078 A * | 11/1994 | Hayashi et al. | 257/24 |
| 5,612,565 A * | 3/1997 | Kusumoto | 257/401 |
| 5,894,164 A * | 4/1999 | Funaki et al. | 257/654 |
| 5,973,380 A * | 10/1999 | Cutter et al. | 257/530 |
| 6,097,063 A * | 8/2000 | Fujihira | 257/339 |
| 6,160,306 A * | 12/2000 | Kim et al. | 257/653 |
| 6,291,834 B1 * | 9/2001 | Hasegawa | 257/48 |
| 6,400,003 B1 * | 6/2002 | Huang | 257/653 |
| 6,518,604 B1 * | 2/2003 | Worley et al. | 257/173 |
| 6,621,138 B1 * | 9/2003 | Alter | 257/530 |
| 6,841,846 B1 * | 1/2005 | Chen et al. | 257/530 |
| 6,943,383 B2 * | 9/2005 | Abe et al. | 257/173 |
| 7,057,258 B2 * | 6/2006 | Tran et al. | 257/530 |
| 7,115,966 B2 * | 10/2006 | Ido et al. | 257/529 |
| 7,880,201 B2 * | 2/2011 | Vlasov et al. | 257/212 |
| 2003/0011042 A1 * | 1/2003 | Kagiwata | 257/529 |
| 2003/0205735 A1 * | 11/2003 | Fujisawa et al. | 257/200 |
| 2007/0108444 A1 * | 5/2007 | Nogami et al. | 257/51 |
| 2008/0036047 A1 * | 2/2008 | Dai et al. | 257/653 |
| 2008/0296727 A1 * | 12/2008 | Vasiliu | 257/529 |
| 2009/0127555 A1 * | 5/2009 | Yamazaki et al. | 257/51 |
| 2009/0140368 A1 * | 6/2009 | Miura | 257/463 |
| 2009/0184388 A1 * | 7/2009 | Izumi | 257/463 |
| 2009/0206381 A1 * | 8/2009 | Shin et al. | 257/300 |
| 2010/0155884 A1 * | 6/2010 | Park | 257/529 |
| 2010/0176483 A1 * | 7/2010 | Iguchi | 257/529 |
| 2011/0127637 A1 * | 6/2011 | Chakravarti et al. | 257/529 |
| 2011/0163406 A1 * | 7/2011 | Miura | 257/463 |
| 2011/0204360 A1 * | 8/2011 | Yamazaki et al. | 257/51 |
| 2011/0248265 A1 * | 10/2011 | Forbes | 257/51 |
| 2012/0112311 A1 * | 5/2012 | Cho et al. | 257/529 |
| 2012/0211747 A1 * | 8/2012 | Stribley et al. | 257/49 |

FOREIGN PATENT DOCUMENTS

| | | |
|---|---|---|
| JP | 04-234173 | 8/1992 |
| JP | 06-120429 | 4/1994 |
| WO | 2005/057660 | 6/2005 |

OTHER PUBLICATIONS

PCT, Written Opinion, International Application No. PCT/GB2009/051082 (mailed May 11, 2010).

Comer, Donald T., "Zener Zap Anti-Fuse Trim in VLSI Circuits," *VLSI Design*, vol. 5, No. 1, pp. 89-100 (1996).

* cited by examiner

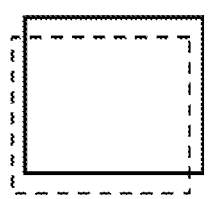
X – Y shift (linear translation )
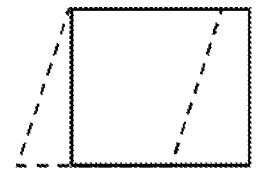
X – Y scale (orthogonally
Perfect registration
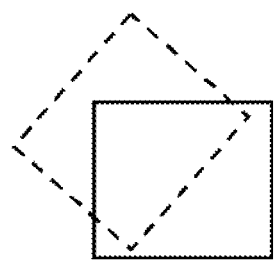
Rotational errors
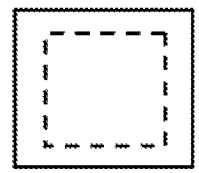
magnification
Fig. 1: Various mis-alignment examples

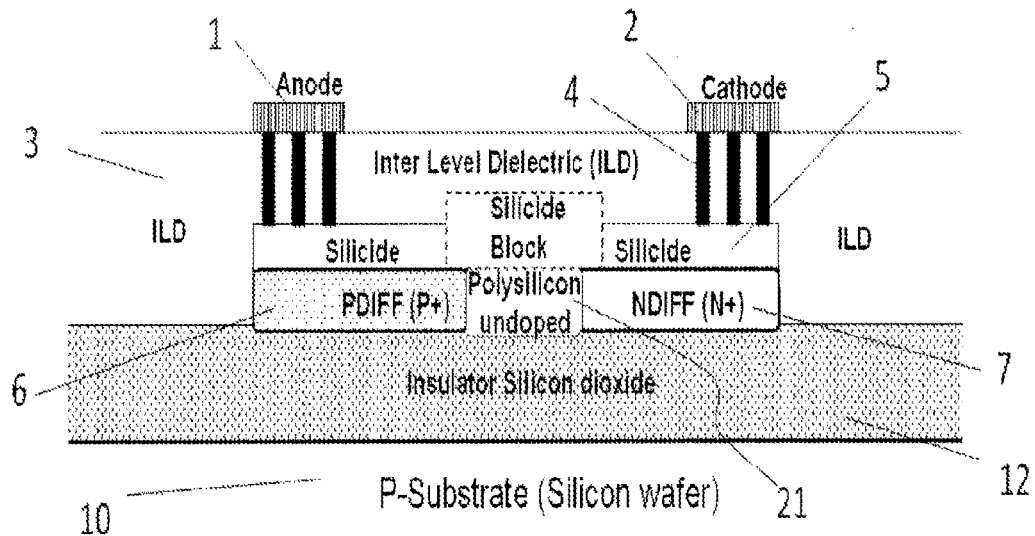
Fig. 3
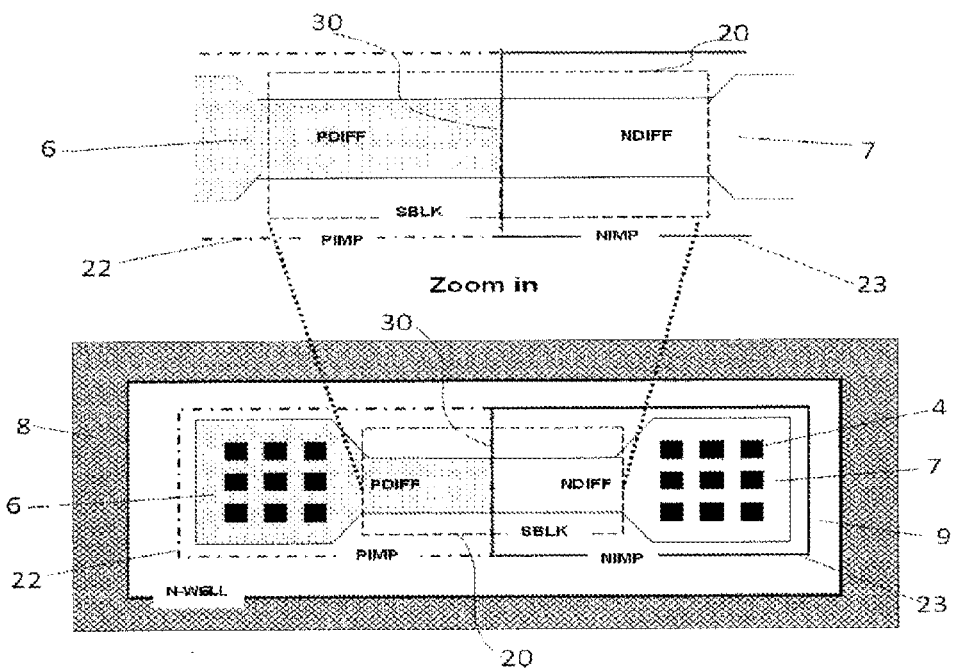
Fig. 4 (a) PRIOR ART

PN JUNCTIONS AND METHODS

This application is a national stage filing of PCT International Application No. PCT/GB2009/051082, the entire contents of which are incorporated by reference herein.

TECHNICAL FIELD

The invention relates to improved PN junctions and methods of making improved PN junctions. The invention has particular applicability to improved Zener Zap diodes, resulting in improved manufacturability and yield of integrated circuits.

BACKGROUND

A zener zap diode has been widely used for One Time Programming (OTP) application in CMOS Processes. In its "unblown" state, the un-zapped (before fusing) zener zap diode has a zener characteristic which appears as an open circuit under reverse bias condition. Moreover, the diode can be made to approach a short circuit by forcing a large reverse current (fusing current ~10 mA) for a short period. Therefore, the applied reverse current maybe sufficient to overcome the junction breakdown voltage and causes a current flow across the reverse-biased PN junction. After the fusing current is reached, the characteristic behaviour of the diode is like a resistive short circuit and the junction no longer acts like an open circuit. By sensing the electrical state of the device, we are able to determine if it is open or short to store the logical state "1" or "0" for Read Only Memory (ROM) circuits. Once shorted, the change is irreversible; this is an OTP device.

The following prior art documents are of general relevance to the invention:
1. Patent GB2382220: Polysilicon diode antifuse
2. Patent EP0789403: Zener zap diode and method of manufacturing the same
3. U.S. Pat. No. 5,973,380: Semiconductor junction antifuse circuit
4. Donald T. Comer, "Zener Zap Anti-Fuse Trim in VLSI Circuits", VLSI Design 1996, Vol 5, No: 1, pp. 89-100.

The resistivity of silicon at room temperature depends on the doping level and impurity material. Here is the data for phosphorus and boron impurities at room temperature:

| Doping level (atoms cm$^{-3}$) | Phosphorus doped resistivity in Ohm · cm | Boron doped resistivity in Ohm · cm |
| --- | --- | --- |
| $10^{14}$ | 44.5 | 133 |
| $10^{15}$ | 4.58 | 13.5 |
| $10^{16}$ | 0.527 | 1.45 |
| $10^{17}$ | 0.0865 | 0.197 |
| $10^{18}$ | 0.0225 | 0.0408 |
| $10^{19}$ | 0.00544 | 0.00881 |
| $10^{20}$ | 0.000803 | 0.00125 |

High values of resistance are usually for device well-region dopings where net doping is of the order ~$10^{17}$ cm$^{-3}$ and resistance is ~1000 ohms/square for layer with a diffusion depth of 1 micrometer. Low values of resistance are seen for ~$10^{20}$ cm$^{-3}$ with resistances at ~100 ohms/square for layers with a diffusion depth of ~0.1 micrometers. Generally degenerately doped regions are thought of as "low" resistances (for silicon), but they are still relatively large compared to more conductive materials such as a metal, eg aluminium has a resistivity of $2.8 \times 10^{-6}$ ohm·cm and iron is about $1 \times 10^{-5}$ ohm·cm Degenerate doping and zener junctions will now be discussed. Doping for n+ or p+ is the well known abbreviation for highly doped semiconductor material, n-type or p-type respectively, which is degenerate in nature. This semiconductor behaves more like a metal due to the number of electrical carriers available in the solid. Doping levels are approximately ~$5 \times 10^{18}$ atoms of impurity per cm$^3$ or higher to make degenerately doped silicon. Intrinsic (undoped) silicon atomic density is approximately $5 \times 10^{22}$ atoms per cm3. We achieve a p+ or n+ doping using a low energy implanted dose of ~$1 \times 10^{15}$ per cm$^2$ which is activated and diffused to a depth of ~0.15 micrometers thus making material with doping density of ~$1 \times 10^{20}$ atoms per cm$^3$.

For lower doped diffusions in silicon (n or p-type) the doping levels are usually much smaller at ~$1 \times 10^{14}$ atoms per cm$^3$ up to ~$1 \times 10^{18}$ atoms of per cm$^3$ of doping. The lower doses give to n-well or p-well are generally ~$1 \times 10^{12}$ atoms per cm$^2$ with silicon diffused depths of ~1 um which gives ~$1 \times 10^{16}$ atoms of per cm$^3$ of impurity doping.

Zener diodes are formed when two heavily doped semiconductors meet and form an electrical n+/p+ junction. The junction forms a depletion region between the n+ and p+ which is extremely thin. This is a region depleted of carriers. Carriers can quantum mechanically tunnel through the thin layer—a zener conduction mechanism, when a relatively small reverse bias is applied to the junction (approximately 4V). The critical feature of zener conduction which is used in antifuse diodes is the low reverse breakdown voltage. We want to be able to take the device into reverse bias breakdown at a relatively low voltage, so that the circuitry supplying the programming voltage is as simple as possible. High voltages are generally more challenging to handle on modern CMOS due to the thin gate oxide regions and lower circuit operating voltages compatible with battery operation. If we apply high voltages, greater than a few volts, to standard CMOS devices we can cause irreversible device degradation or component destruction.

The diode junction used more commonly is n/p junction where the doping is lower and hence the depletion region thickness is larger. In that case it is too thick to allow tunnelling and the conduction process proceeds by a carrier avalanche ionisation mechanism when the reverse voltage is applied to a sufficient value, usually about 10V or higher. At such high voltages the electric field in the depletion layer is high enough to accelerate any electrons injected into it to a higher energy, which can then cause further electron pairs to be created by ionisation interaction with the surrounding material. In that case the conduction is not uniform through the junction; there are "hot spots". Current crowding through hot spots can cause localised junction damage at points of weakness. These voltages are also high enough to cause irreversible electrical damage to CMOS circuits—eg the gate oxide breakdown voltage can be less than 10V.

Avalanche breakdown is in contrast to the zener conduction mechanism which is more uniform through the junction, stable and can be engineered to occur at lower voltages.

Zener diodes which need to pass a lot of current need to have a large junction area. These are usually made vertically in the material. But the antifuse construction is made laterally, with the highly doped regions butted at the surface of the semiconductor. In that case the cross-sectional area of the junction perpendicular to the current flow is quite small. We create a narrow region too ~1 micrometer wide and about 0.15 micrometer deep. When a small current of ~5 mA is passed through the small zener region this causes heating and consequent irreversible damage to the junction zone. The diode properties are destroyed and it becomes conductive in both directions. It behaves like an ohmic resistor instead of a diode which would only conduct significantly in the forward direction. The antifuse is designed so that the diode is normally operated in reverse bias. It moves from a poorly conducting diode-like state to a conductive resistive state once the junction has been damaged by a high current passing through. These are known in the industry as "zener zap diodes".

SUMMARY

The invention provides a PN junction, diode, Zener diode, Zener zap diode, and method as set out in the accompanying claims.

The invention can provide a solution for the tight tolerances of the P+/N+ diffusion layers which are required to achieve high manufacturing yields. The novel layout structures of the present invention can provide a way to reduce misalignment sensitivity inherent in exposing a wafer at different stages in the photo alignment equipment.

The invention can also provide a diode that is more accurately and reliably created compared to conventional device layout styles.

The zener zap diode (dzap) is used on sub-micron CMOS IC products to make OTP memories. Improving the yield of the component and its manufacturability provides benefits, since higher yield per wafer gives a lower cost per working chip. It is also of benefit since fewer wafer failures will occur at PCM parametric test which are attributable to manufacturing variations. This reduces waste, lowers costs to the manufacturer, promotes manufacturing efficiency and improves on-time delivery through a greater success rate.

BRIEF DESCRIPTION OF DRAWINGS

FIG. 1 shows the components of registration in integrated circuit fabrication process.

FIG. 3 shows a cross-sectional view of a polysilicon zener zap diode with a layer of undoped polysilicon (21) on an insulating (silicon dioxide) layer (12) on a semiconductor wafer (10).

DETAILED DESCRIPTION

Figure 2:
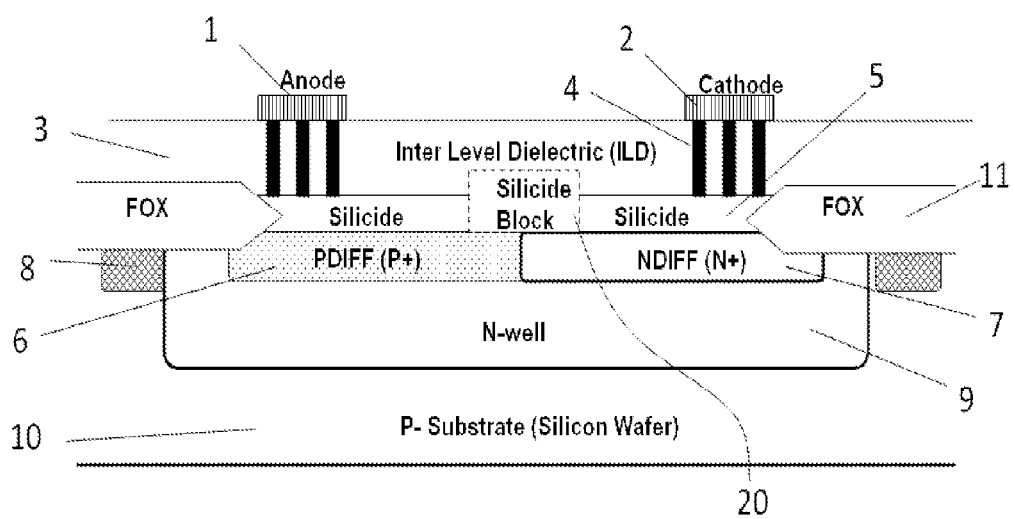
FIG. 2 shows a simplified cross-section view of a zener zap diode on a semiconductor wafer (10) which is an embodiment of the present invention, where the cross-section is taken at the precise cross-over point of N+ and P+ regions, or alternatively it can be regarded as a cross-section of a conventional zener zap diode in which adjacent N+ and P+ regions are considered to be perfectly abutted.

Before turning to a description of embodiments with reference to the figures, we first make some general comments about the preferred embodiments.

A Zener diode has high doping levels (N+ and P+) and a thin depletion zone, which allows carriers to tunnel across the depletion zone. A zap diode has a conducting junction with a relatively small area, which results in higher current density across the junction, causing the antifuse to fuse at lower current.

An embodiment of the invention relates to the improved mask layout design style of the zener zap diode (anti-fuse diode) to improve manufacturability and yield of integrated circuits. It is suitable for One Time Programming (OTP) application in CMOS fabrication processes. The conventional P+ (22) and N+ (22) diffusion layers (30) style of the zener zap diode shown in FIG. 4(a) is sensitive to the photo mask alignment during the fabrication of the diode. Alignment error for P+ and N+ photo mask sets may affect the performance and yield of the diode. However, the pattern with "saw-tooth (31)" or "wave (32)" styles (FIGS. 4(b) and 4(c) respectively) at the semiconductor PN junction improves the manufacturability. This is because these structures are partially overlapped between P+ (22) and N+ (22) diffusion layers and avoid sensitivity to misalignment between each other on the photo mask set. These design styles can be applied to the other semiconductor materials such as silicon, germanium and etc. In addition, these style attributes can also be applied on polysilicon zener zap diodes (see. Pat. No. GB2382220).

The zener zap diode is constructed horizontally and is compatible with planar integrated circuit processing. In the CMOS fabrication process, there are different levels of mask set for fabricating the diode and other semiconductor devices. For instance, the mask set used in wafer processing includes diffusion, isolation, contact, metallisation layers and other mask layers. These mask sets are dependent on the fabrication and wafer processing technology.

The procedure of positioning a mask set with respect to a previously printed mask set is called alignment. In CMOS technology, many device structures are automatically aligned to previously formed structures by using optical alignment techniques on photolithography equipment. However, these alignment techniques introduce error (mis-alignment) from one photo mask level to the next level. This is a key part of the exposure process since mis-alignment of the printed pattern to the previous layers will result in a non-functioning die. As dimensions get smaller and tighter, alignment becomes even more difficult as the margin for error reduces.

The first layer that is patterned on the wafer has to use the wafer itself for alignment. Most wafers will have either a notch or a flat to setup this initial alignment. After alignment to the notch or the flat, the wafer is automatically positioned under the mask and the exposure system activated. Once this first layer is patterned, a series of alignment marks will also be printed in regions around the wafer (outside the die). The subsequent layers will reference these marks and use them to determine where the next layers should be patterned.

In wafer fabrication, the alignment of each layer to the one underneath is called registration. Therefore, registration is the process of determining how well aligned one layer is to the next as shown in FIG. 1.

Typically, four components of registration are considered:
(i) X-Y shift (linear translation)
(ii) X-Y scale (orthogonally)
(iii) rotational errors
(iv) magnification Issues in mis-alignment will always occur since the wafer surface is never exactly the same from layer to layer. The same part of the lens may not be focusing on the same area as previously etc. This error can affect the performance and yield of the diode especially for N+ and P+ diffusion layers. A close proximity of the N+ to the P+ diffusion layer is required, in order to control the electrical properties of the diode for example leakage, resistance and zener breakdown voltage.

But the alignment process is never perfect and hence there is an inevitable degree of variation in the mis-alignment for the N+ versus the P+ layers both across wafer, from wafer to wafer and lot to lot. The mis-alignment causes variability in the electrical behaviour of the fabricated component. In extreme cases the mis-alignment causes the device to completely fail to function correctly, eg by increasing the reverse breakdown beyond the required value, or by increasing the internal series resistance too much.

Preferred embodiments relate to the alignment between the N+ layer and the P+ layer during the wafer-level processing. This is because the alignment of the N+ and P+ diffusion regions has a big impact on the device breakdown voltage. The zener breakdown junction is located at the silicon surface and therefore sensitive to the alignment of N+ and P+ regions. If the regions overlap they will counter-dope, and if there is gap between the regions then there is again a low dope region, which increases the breakdown voltage. Thus, a good alignment and critical dimension (CD) control of the N+ and P+ layers is necessary to ensure that the zener breakdown voltage is tightly controlled. Therefore, the structures on these layers must be precisely positioned so that the finished diode has a high accuracy to achieve its output specification.

We now turn to description of the preferred embodiments with reference to the accompanying figures.

As noted above. FIG. 2 can be regarded as showing either a cross-section through an embodiment of the invention, where the cross-section is taken at the precise cross-over point of N+ and P+ regions, or alternatively it can be regarded as a cross-section of a conventional zener zap diode in which adjacent N+ and P+ regions are considered to be perfectly abutted. The diode comprises the anode (1) and the cathode electrodes (2) and the anode and cathode comprising a metal silicide layer (5) in contact. The diode junction is formed from the P+ doped (6) and N+ doped regions (7) within N-well (9) enclosure on a silicon wafer (10) which is P-type substrate. The connection regions are junction isolated from the substrate.

FIG. 3 shows a cross-section of a polysilicon anti-fuse. The polysilicon diode antifuse is isolated from the substrate by a layer of silicon dioxide insulator (12).

Figure 4:
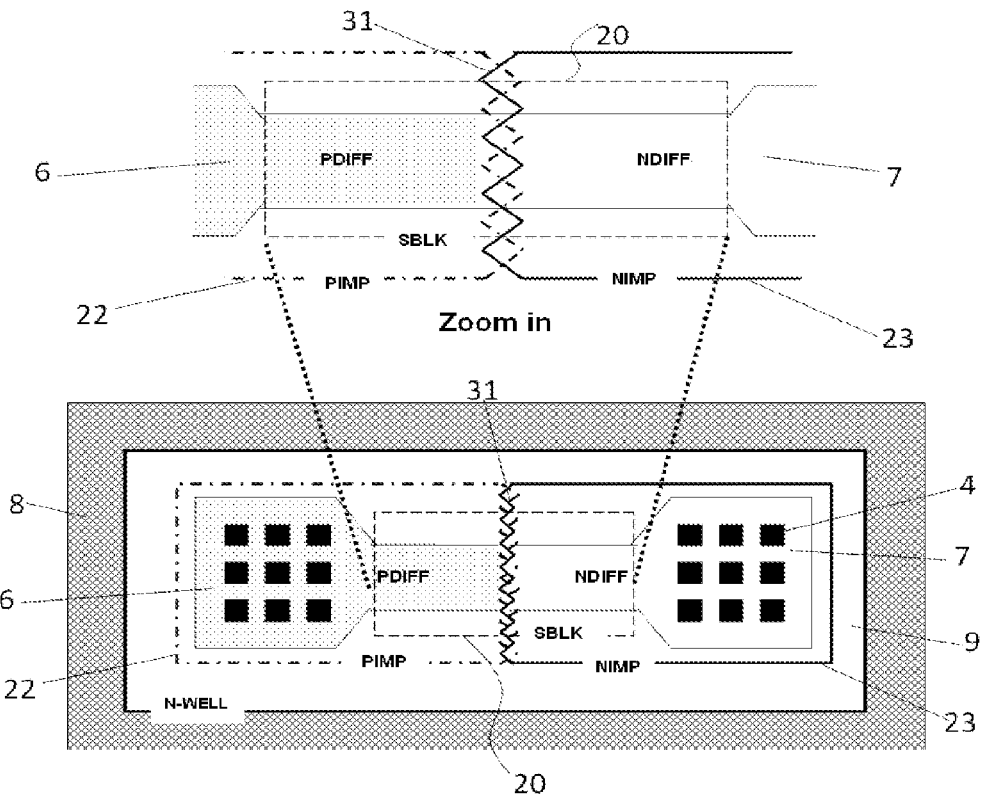
FIG. 4(a) shows a top view of a conventional style P+ (22) or N+ (23) diode created by diffusion photolithographic masks.
FIG. 4(b) shows a "saw-tooth (31)" style P+ (22) or N+ (23) diffusion mask layers top view to explain a novel pattern of a zener zap diode relating to one embodiment of the present invention.
FIG. 4(c) shows a "wave (32)" style P+ (22) or N+ (23) diffusion mask layers top view to explain a novel pattern of a zener zap diode relating to one embodiment of the present invention.
Figure 4:
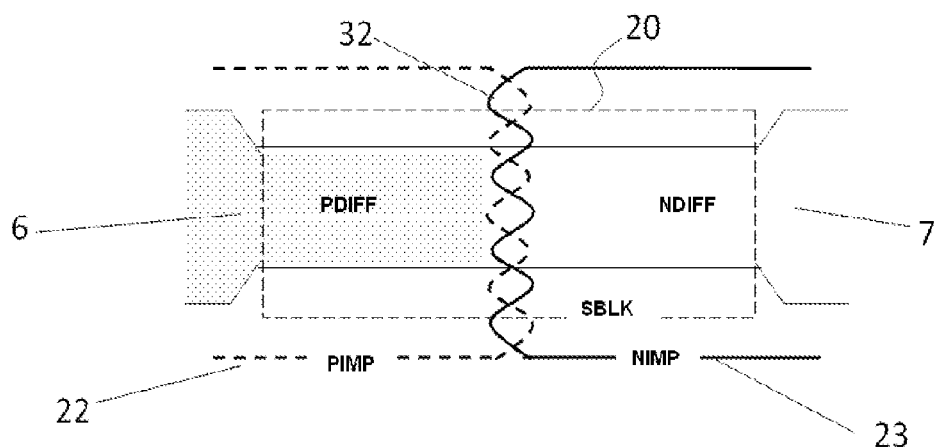

FIG. 4 (a) illustrates the conventional pattern of the P+ and N+ regions at the PN junction (30). The pattern is a representation of an integrated circuit in terms of planar geometric shapes which correspond to the patterns of diffusion layers that make up the diode. In the layout, P+ and N+ regions, (6) and (7) respectively, determine the conducting active areas of the diode. In the present embodiment, P+ and N+ photolithographic masks are necessary for the selections of areas for doping of p-type and n-type impurities. For the silicide process, a silicide blocking mask is used to define an area of a material which is used to prevent the silicide formation over the junction region in the zener zap diode. Otherwise, the silicide would short-circuit the junction. The silicide block (20) material is an insulating layer, for example silicon dioxide $SiO_2$ or silicon nitride $Si_3N_4$, or a combination of these, which do not react with metals used in the silicide process.

FIG. 4 (b) is a mask layout view of a zener zap diode in accordance with an embodiment of the invention using "sawtooth (31)" style edges of the N+ and P+ regions for improved manufacturability.

FIG. 4 (c) shows another structural arrangement of the P+ and N+ layers of the diode using a diffusion layer with "wave (32)" style edges to improve alignment tolerance during manufacturing and hence ensure high yield.

Figure 5:
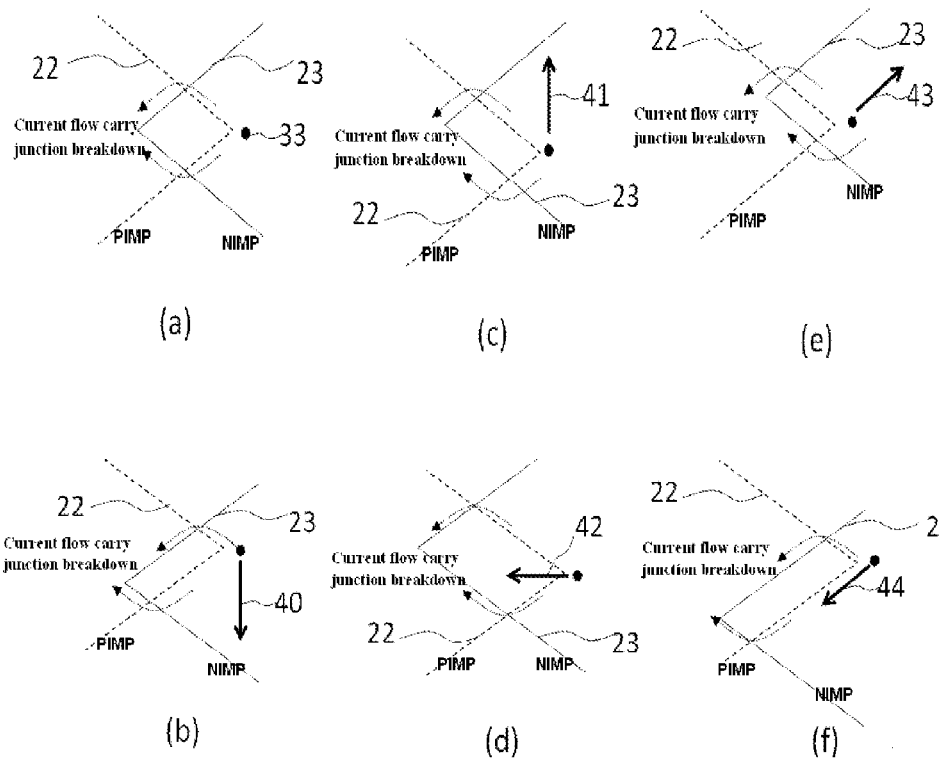
FIG. 5(a) shows a precise alignment positioning (33) of P+ (22) and N+ (23) diffusion layers during the fabrication process.
FIG. 5(b) shows misalignment of the diffusion layers (22/23) with downward arrow (40).
FIG. 5(c) shows misalignment of the diffusion layers (22/23) with upward arrow (41).
FIG. 5(d) shows misalignment of the diffusion layers (22/23) with leftward arrow (42).
FIG. 5(e) shows misalignment of the diffusion layers (22/23) with right diagonal arrow (43).
FIG. 5(f) shows misalignment of the diffusion layers (22/23) with left diagonal arrow (44).

FIG. 5 (a) to FIG. 5 (f) show the current path of a PN junction with a "saw-tooth" style antifuse layout under different misalignment conditions. Using the structure having the "saw-tooth" style, misalignment tolerance between the diffusion layers can be improved. The structure also reduces the effect of any misalignment between the layers.

As seen in the diagram, the current flow is through the cross-over regions (between N+ and P+ areas) which are the lowest resistance areas. In overlapped zones, the P+ and N+ areas counter dope and this increases resistance to current flow. In non-overlapped zones, the resistance is high as the doping is merely that of the well region. Cross-over points are thus the critical areas for conduction. A "saw-tooth" edge (formed from triangular shapes) maximises the number of cross-overs for a given width. This is also important. Misalignment of the P+ to N+ areas will just move the position of the cross-over but not prevent it from being made. This feature allows the PN junction (and hence the diode) to work for all reasonable misalignment during manufacture of the diode.

Figure 6:
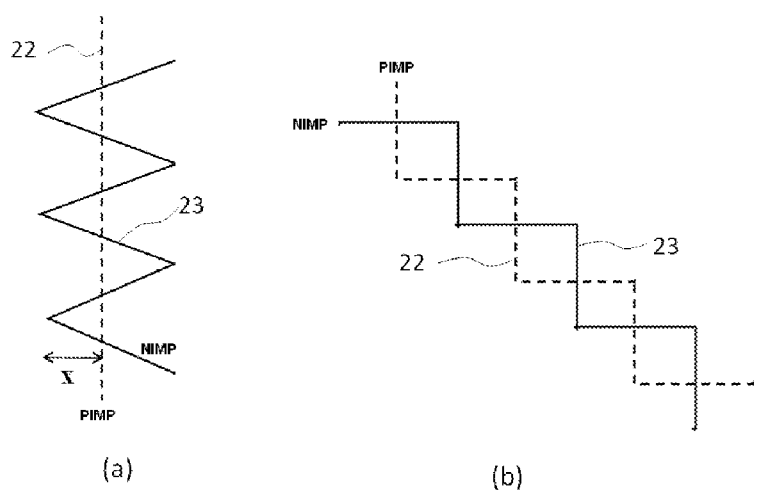
FIGS. 6(a) and (b) show alternative embodiments of the overlapping regions of P+ and N+ areas.

In the embodiment of FIG. 6(a) one of the P+ or N+ layers can be "saw-tooth" shaped and the other straight-edged. The cross-overs are still formed by the composite shape (see FIG. 6a).

The edges could be tilted in another embodiment, like a "stair-case" as shown in FIG. 6b. Silicon crystals have two natural cleave directions, at right angles to each other, which correspond with the grid alignment of the chips produced from the crystal. Components are created on the crystal in alignment with this grid. Features printed at 90° to this grid, or to the cleave directions, are often better controlled in manufacture, because the mask making procedure "rasterises" the shape into horizontal rectangles or strips. During manufacture of a chrome and glass mask an electron beam moves along raster lines to expose a photosensitive layer, which is then developed in order to etch the chrome from the glass.

The overlap distance X in FIG. 6a needs to be large enough to remain positive for all manufacturing conditions, i.e X needs to be larger than the worst case misalignment between layers.

In all embodiments, the overlap distance, X, of the n+ and p+ regions is critical to enable the manufacture of the components. X needs to be larger than the minimum overlay tolerance of the stepper lithographic tool. Overlay tolerance for 365 nm mercury i-line photolithographic steppers has specification of approximately 120 nm for two layers aligned to the global alignment targets. Hence a total overlap of the two layers about 150 nm is required to ensure that they always overlap when made across the surface of any wafer and to allow for any lot to lot variations.

In the experimental structures we designed, the overlap X was 200 nm and the pitch of the saw-tooth was 400 nm so that there could be four or five cross-overs per micrometer of device width. There is no restriction to the number of cross-overs that will function as a semiconductor junction. In preferred embodiments the overlap X is preferably in the range 10 nm to 1,000 nm, and most preferably in the range 100 nm to 500 nm.

The size of the teeth of the saw-tooth needs to be big enough to print cleanly using the photolithographic tool. For a 365 nm mercury i-line stepper the minimum feature size is 0.35 um and so this limits the minimum pitch of the saw-tooth to about 350 nm. Smaller feature sizes would also work, but require more precise lithographic equipment to print them faithfully on the wafer. If the pitch is smaller then the amplitude of the shape will be attenuated by the lithographic process and hence the resultant tolerance to misalignment is poorer.

Figure 7:
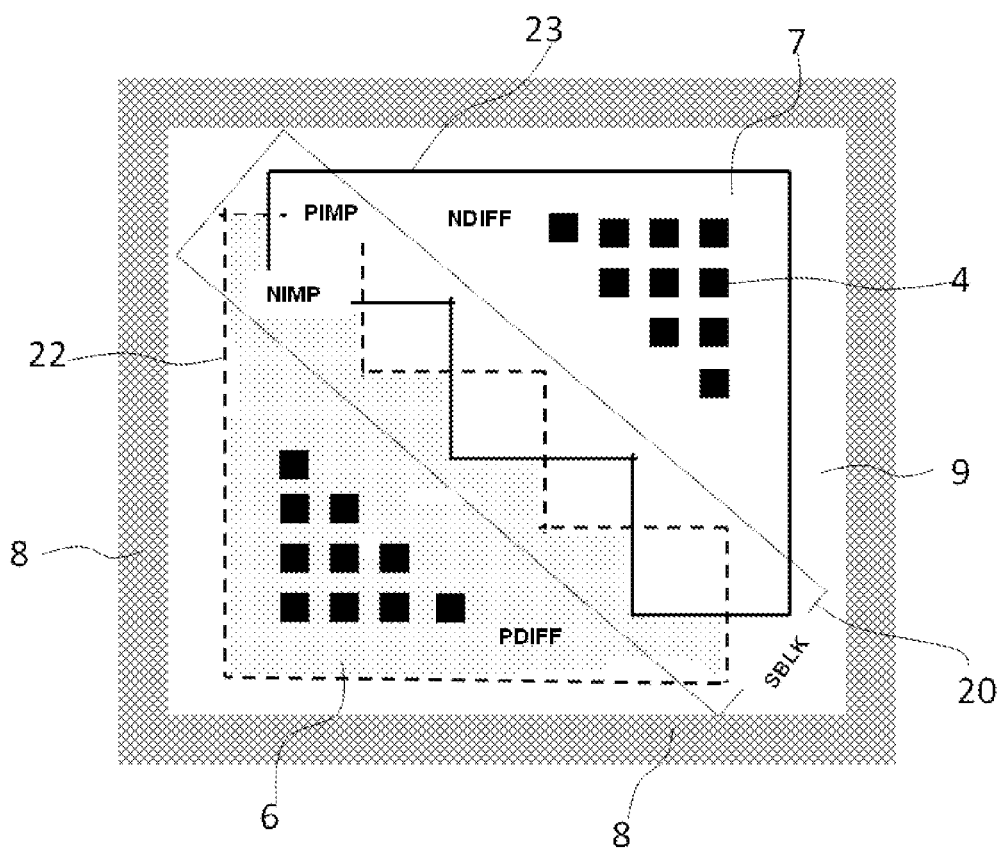
FIG. 7 shows a Zener diode based on the embodiment of FIG. 6(b), whereby the area occupied by the diode can be minimised.

Another challenge is the overall size of the OTP diode, which should be minimised. In FIG. 7, we show an improved layout style which: —
  i) maximises the junction width (by aligning the junction along a diagonal of a rectangular diode area)
  ii) minimises the area (using a simple rectangular diode shape)
  iii) uses the "saw-tooth" or "stair-case" overlap style to maximise yield.

The invention is advantageous, primarily due to the insensitivity of the design to any mis-alignment of the N+ and P+ implantation masks compared to the standard methods of simply positioning the diffused regions as close together as possible, or overlapping them very slightly. The invention ensures that for all reasonable mis-alignments of these layers, there is always the same number of N+ to P+ implant layer cross-overs. These cross-overs form the critical junction regions where the device will break down when a reverse voltage is applied, and also to conduct current after breakdown. Since these cross-overs are consistently created, the variability of the junction electrical behaviour is minimised.

Another advantage is that the design will function for mis-alignments where a standard device layout with a butted junction will fail to operate properly. The increased tolerance for mis-alignment means that the device yield and manufacturability is improved compared to the standard device.

Also by adopting the new arrangement style where the N+ to P+ regions are formed in an oblique line of saw-tooth (or staircase) overlapped shapes as in FIG. 7, the area occupied by the component can be minimised. The new layout style has a smaller area than an equivalent design using the standard method. In the standard method the diode is created as a dog-bone shape (see FIG. 4a). The dog-bone shape reduces the area of the junction, causing the antifuse to fuse at lower current. The oblique saw-tooth design allows the greatest number of cross-overs to be created for a given size of diode. The size of the diode still needs to be sufficient to accommodate a multitude of connecting contacts (4) to ensure that enough current can flow through it. These are created in the remaining diode areas as triangular shaped contact arrays, see FIG. 7. By minimising the device area, a greater number of components can be fabricated for a given area, or alternatively a smaller area is required to make the same number of devices. Smaller areas yield higher, since they have less chance of capturing defects than large areas. Hence the smaller design is very efficient and higher yielding due to this feature compared to the standard design dog-bone shape.

The PN junctions described above can be formed from crystalline silicon or polycrystalline silicon.

A preferred method of forming the PN junctions described above is to cover the silicon with a photosensitive resist layer, expose this layer through a mask, apply a developer chemical to develop and remove exposed areas of the resist, bake the resist, implant the silicon with the relevant impurities using an ion beam in an implanter machine, strip away the resist layer, and anneal at high temperature for a short time under hot lights in order to activate the doping so that the impurity atoms become substitutional defects.

The method is fully compatible with standard CMOS manufacturing processes. This is important to minimise the cost of manufacture. It also means the devices can easily be made with others for integrated circuits.

The embodiments of FIGS. 4(b) through 7 above describe n-type and p-type regions having projections of various shapes, such as the saw-tooth projections of FIG. 4(b) and the sinusoidal-like projections of FIG. 4(c). The peak to trough amplitude of the projections in the preferred embodiments is 200 nm, and the preferred embodiments are made on a 350 nm CMOS technology. Preferred ranges for the peak to trough amplitude of the projections are 10 nm to 10,000 nm (10 micrometers), or alternatively 100 nm to 1,000 nm. Modern CMOS is ~45 nm minimum feature size and approaching the limit for optical lithography. But the older generations of technology were much larger dimension and 1 micrometer CMOS is still in mainstream manufacture.

The pitch of the saw-tooth designs in the preferred embodiments is 400 nm—this is the spacing of the "teeth" in the saw-tooth, measured between the centres of adjacent teeth. Again this will depend on the minimum feature size for the CMOS technology. This could be in the range 10 nm to 10000 nm, or alternatively 100 nm to 1,000 nm, and could be as small as the minimum feature size for the target technology. It would be necessary to ensure that the shapes were printed reasonably faithfully on the wafer. In this case the perfect triangular shapes would look a little rounded and appear more like a sinusoid pattern in the resist after developing the image.

The number of projections could be a small as one. There is no upper limit. What we are trying to make is cross-overs between the shapes, also that these cross-overs are made in the active area of the device. In that case the number of cross-overs may be from one upwards, without an upper limit. The cross-overs need to be at an angle (it is important that these are not parallel edges, so that they do cross). We have tended to use patterns that had cross-overs at 90 degrees or 45 degrees, for ease of design, because the angle itself is not very important. It is important merely that they do cross-over and that misalignment does not cause the cross-over to move away from the device active area. The latter could happen if the angle of one edge to the other was too shallow.

In the preferred embodiments we deliberately minimise the conducting areas because the current flow is concentrated on the cross-over points of the n+ and p+. Overlapping n+ and p+ implants will counter-dope so that the net carrier density is low. This means that the counter-doped region is not so conductive. Areas where the n+ or p+ are not implanted are low doped, hence high resistance. Hence the current is preferentially focussed through the n+ and p+ non-counterdoped parts, which are the most conductive—they meet in the junction at the cross-over points.

We prefer to have a number of n+/p+ cross-overs to ensure that the junction properties are repeatable. Components made with single or double cross-over do function as diodes, but the control of the breakdown voltage for example is worse than diodes made with more cross-overs (eg four). In the single case we are forced to make a single tiny area repeatably, which is difficult. For diodes made with multiple n+/p+ cross-overs there is a statistical benefit to the behaviour and this helps to make the junction electrical properties more repeatable when adjacent components are compared. In the invention we would like the number of cross-overs to be more than one (in the experimental designs I used one, two and four cross-overs); however, the junction will still be formed for one cross-over.

What is claimed is:

1. A PN junction comprising first and second areas of a semiconductor material, wherein one of said first and second areas comprises n-type doping and the other of said first and second areas comprises p-type doping, said n-type doping and said p-type doping having substantially similar doping densities, wherein said first area has one or more projections which at least partially overlap with said second area, so as to form at least one cross-over point and at least one counter-doped region, said at least one counter-doped region having a substantially lower net carrier density than non-overlapped regions of said first and second areas, said cross-over point being a point at which an edge of said first area crosses over an edge of said second area, and wherein said projections of said first area overlap said second area by a distance of at least 100 nm.

2. A PN junction as claimed in claim 1, wherein said second area also has one or more projections which at least partially overlap with said first area.

3. A PN junction as claimed in claim 1, wherein said projections have a saw-tooth or triangular shape.

4. A PN junction as claimed in claim 1, wherein said projections have a generally sinusoidal shape, or other wave-like shape.

5. A PN junction as claimed in claim 1, wherein the amplitude of said projections, measured from peak to trough, is within the range 10 nm to 10,000 nm.

6. A PN junction as claimed claim 1, which is rectangular in shape, and in which said projections extend generally along a straight line between opposite corners of said rectangular shape.

7. A PN junction as claimed in claim 1, wherein a spacing between the centers of adjacent projections of said first area is within the range 10 nm to 10,000 nm.

8. A PN junction as claimed in claim 1, wherein the semiconductor material is silicon.

9. A diode comprising a PN junction as claimed in claim 1.

10. A Zener diode comprising a PN junction as claimed in claim 1.

11. A Zener zap diode comprising a PN junction as claimed in claim 1.

12. A method of forming a PN junction, comprising the steps of:
 a) doping a first area of a semiconductor material with either n-type or p-type dopants;
 b) doping a second area of said semiconductor material with the other of n-type or p-type dopants relative to said first area, said n-type doping and said p-type doping having substantially similar doping densities;
 c) ensuring that at least said first area has a plurality of projections which at least partially overlap with said second area, so as to form at least one cross-over point and at least one counter-doped region, said at least one counter-doped region having a substantially lower net carrier density than non-overlapped regions of said first and second areas, said cross-over point being a point at which an edge of said first area crosses over an edge of said second area,
 and wherein steps a) and b) can be performed in either order.

13. A PN junction as claimed in claim 6, wherein said projections extend in a stair-case pattern between opposite corners of said rectangular shape.

14. A PN junction as claimed in claim 13, wherein the edges of said projections which form said stair-case pattern are arranged generally parallel to the edges of said rectangular shape.

15. A PN junction as claimed in claim 1, wherein said projections of said first area overlap said second area by a distance of between 100 nm and 500 nm.

16. A PN junction as claimed in claim 1, wherein four distinct regions are identifiable around the cross-over point, such that going in a circular trajectory about the cross-over point the doping of the semiconductor material is substantially:
 said p-type only, both said n- and p-type, said n-type only, and neither of said n-type and p-type.

17. A PN junction as claimed in claim 1, wherein the angle between an edge of said first area and an edge of said second area at the cross-over point is in the range 30 to 90 degrees.

18. A PN junction as claimed in claim 1, wherein the angle between an edge of said first area and an edge of said second area at the cross-over point is substantially 45 degrees or substantially 90 degrees.

19. A PN junction as claimed in claim 8, wherein said areas of silicon are formed from polycrystalline silicon.

20. A method as claimed in claim 12, wherein the semiconductor material is silicon.

* * * * *